US007791386B2

(12) United States Patent
Kris

(10) Patent No.: US 7,791,386 B2
(45) Date of Patent: Sep. 7, 2010

(54) EXTERNALLY SYNCHRONIZING MULTIPHASE PULSE WIDTH MODULATION SIGNALS

(75) Inventor: Bryan Kris, Gilbert, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 66 days.

(21) Appl. No.: 12/351,371

(22) Filed: Jan. 9, 2009

(65) Prior Publication Data

US 2009/0184742 A1 Jul. 23, 2009

Related U.S. Application Data

(60) Provisional application No. 61/022,980, filed on Jan. 23, 2008.

(51) Int. Cl.
*H03L 7/00* (2006.01)
(52) U.S. Cl. ........................................ 327/160; 327/141
(58) Field of Classification Search ................. 327/141, 327/160
See application file for complete search history.

(56) References Cited

U.S. PATENT DOCUMENTS

| | | | | |
|---|---|---|---|---|
| 5,705,945 | A * | 1/1998 | Wee ............................ | 327/105 |
| 6,480,047 | B2 * | 11/2002 | Abdel-Maguid et al. .... | 327/161 |
| 7,177,166 | B1 | 2/2007 | Kris ............................ | 363/41 |
| 7,593,500 | B2 * | 9/2009 | Kris ............................ | 375/376 |
| 2006/0034364 | A1 | 2/2006 | Breitzmann ................. | 375/238 |

OTHER PUBLICATIONS

Notification of Transmittal of the International Search Report and the Written Opinion of the International Searching Authority (14 pages), Jul. 24, 2009.
Rahman et al., "A Hybrid Technique for Three Phase Synchronous PWM Waveform Generation for Static Converters" *IEEE Catalogue No. 98EX13 7* (pp. 538-541), Mar. 1, 1998.
Sato et al., "Multi-Phase Converter Controlled by Hysteretic PWM Method" *Power Conversion Conference* (pp. 1134-1138), Apr. 1, 2007.
Young-Min Park et al., Practical Implementation of PWM Synchronization and Phase-Shift Method for Cascaded H-Bridge Multilevel Inverters Based on a Standard Serial Communication Protocol *IEEE Transactions on Industry Applications* (pp. 634-643), Mar. 1, 2008.

* cited by examiner

*Primary Examiner*—Hai L Nguyen
(74) *Attorney, Agent, or Firm*—King & Spalding L.L.P.

(57) ABSTRACT

Waveform errors between multiphase PWM signals caused by external synchronization signals is solved by providing a capture register in a master time base circuit. The capture register is triggered by the external sync signal so as to "capture" the value of the master time base counter at the occurrence of the rising edge of the external sync signal. This captured counter value is then provided to the local time bases of each of the phase PMW signal generators as the effective PWM period instead of locally stored PWM period values of each PWM signal generator. The captured time base value provided to the individual PWM generator time bases insures that the individual PWM generators remain properly synchronized to the master time base throughout the PWM cycles of all of the phases.

3 Claims, 8 Drawing Sheets

EXTERNALLY SYNCHRONIZING MULTIPHASE PULSE WIDTH MODULATION SIGNALS

RELATED PATENT APPLICATION

This application claims priority to commonly owned U.S. Provisional Patent Application Ser. No. 61/022,980; filed Jan. 23, 2008; entitled "Externally Synchronizing Multi-Phase Pulse Width Modulation Signals," by Bryan Kris; and is hereby incorporated by reference herein for all purposes.

TECHNICAL FIELD

The present disclosure relates to using pulse width modulation, and more particularly to, externally synchronizing multi-phase pulse width modulation signals.

BACKGROUND

Pulse width modulation (PWM) controllers are effectively being used to control voltage levels in power supplies and to control rotational speed and direction of motors. For motor control, a direct current (DC) power source is switched on and off at various rates to produce an alternating current (AC) waveform that is used to control the speed and rotational direction of the motor. Motors and some power loads require multiphase power, e.g., three phase power to operate. In a multiphase PWM power controller the PWM waveforms have the same frequency with a phase deference between each of the PWM waveforms, e.g., three-phase typically will be 120 degrees phase deference between PWM waveforms.

In a typical digital multiphase PWM generator circuit, there is a "master" time base circuit composed of a counter, a period register, and a digital comparator. The master counter counts up from zero until its value matches the value stored in the period register. When the comparator detects an equality situation between the master counter and the period register, the comparator generates a signal that resets the master counter and is broadcast to all of the individual PWM generator circuits. This master time base reset signal commands the individual PWM generator circuits to initialize their internal time base counters to predetermined values. Following the master time base counter reset signal, the individual time base counters count upward until they match the roll over value (period). Each of the individual counters can then reset and the counting process begins again (repeatedly).

Synchronizing multiphase PWM signals, that share the same period and duty cycle, with an external synchronization signal allows the multiphase PWM signals to acquire the same phase and period of the synchronizing signal. However, using an external synchronization signal to synchronize multiphase pulse width modulation (PWM) signals may be problematic with existing known PWM synchronization technologies. The sync signal provides both phase and period information, but existing external synchronization techniques only recover the phase information from the external sync signal. In multiphase PWM generation, the loss of sync period information yields corrupted multiphase PWM waveforms.

SUMMARY

Therefore there is a need for a way in which the external synchronization signal may be used with the internal time base counters of each PWM generator of the multiphase PWM generation system so as to create the desired synchronized multiphase PWM signals without substantial PWM waveform corruption between the PWM phases.

When performing external synchronization with multiphase PWM, the period of the external sync signal is not known. This may cause waveform errors between the multiphase PWM signals because each one of the respective phase PWM generators uses a local (internal) time base value while the master time base is controlled by the external sync signal.

According to the teachings of this disclosure, a solution to the problem of causing waveform errors between the multiphase PWM signals when used with an external sync signal is to provide an internal capture register in the master time base circuit. The capture register is triggered by the external sync signal so as to "capture" the value of the master time base counter at the occurrence of the rising edge of the external sync signal. This captured counter value is then provided to the local time bases of each of the phase PMW signal generators as the effective PWM period instead of the locally stored PWM period value of each PWM signal generator. The captured time base value provided to the individual PWM generator time bases insures that the individual PWM generators remain properly synchronized to the master time base throughout the PWM cycles of all of the phases.

The use of the captured master time base value will prevent the individual PWM generator time base counters from sequencing through invalid count values. For example, assume the programmed period value is 1000 (decimal) and the period of the external synchronization signal is 900. Without the master time base counter capture register to limit the count sequences, the individual PWM generator time base counters will count to 900, 901, 902, etc., and up to the programmed value of 1000 (decimal). The resultant multiphase PWM waveform duty cycle and phase offsets will become badly distorted. Thus the use of a master time base capture register prevents the erroneous "high number" count sequences from occurring in the individual PWM generator time base counters.

Another problem that can occur when externally synchronizing multiphase PWM signals is that the lower "numbers" of a count sequence can be deleted by the forced "initialization" of the individual PWM generator time base counters whenever the master time base master time base counter rolls-over. Normally, it is desirable for the master time base counter roll-over event to force the individual PWM generator time base counters to reload themselves with the contents of their associated phase offset registers. This process is what creates the phase shifted relationships of the multiphase PWM signals.

However, if the period of the external synchronization signal is varying over time, the forced "re-initialization" process can also distort the count sequences of individual PWM generator time base counters. Instead of the individual PWM generator time base counters counting up to their maximum value and then rolling over to zero, thereby progressing through their counting sequences in a clean fashion, the "initialization" process may cause the individual PWM generator time base counters to experience jumps in the number sequences or even miss may count values. Typically, the aforementioned initialization process will delete valid "low numbers" the count sequences.

According to the teachings of this disclosure, a solution for the above described problem is to force the individual PWM generator time base counters to reinitialize only when the associated phase register value has been updated. This combination of the master time base capture register and the "limited" use of the individual PWM generator time base counter processes shall be referred to hereinafter as "soft synchronization." The result of this operational combination is that the multiphase PWM signals are not instantly synchronized at the synchronize signal edge, but rather it occurs over an entire PWM period. An advantage of soft synchronization is that the resultant multiphase PWM signal waveforms are not distorted as compared to resulting waveform distortion caused by the simultaneous and instantaneous resetting of the individual PWM generator time base counters during a "hard synchronization."

According to a specific example embodiment of this disclosure, an apparatus for externally synchronizing multiphase pulse width modulation (PWM) signals may comprise: a master time base generator (500) may comprise a master counter (508) having a master count value and coupled to a clock generating a plurality of clock pulses, wherein the master counter (508) increments the master count value for each of the plurality of clock pulses received; a period register (512) having a period value; a period comparator (510) coupled to the period register (512) and the master counter (508), wherein the period comparator (510) compares the master count value to the period value and generates an asserted output when the master count value is equal to or greater than the period value; a capture register (542) having an input coupled to the master counter (508) and a control input coupled to a master time base synchronization (TBS) signal (548), wherein the capture register (542) stores the master count value when the master TBS signal (548) is asserted; a multiplexer (544) having a first input coupled to the period register (512), a second input coupled to the capture register (542), an output comprising a roll-over value (546), and a control input coupled to an external synchronization enable signal (552), wherein the second input is coupled to the output (546) when the external synchronization enable signal (552) is asserted, otherwise the first input is coupled to the output of the multiplexer (544); master synchronization logic, wherein the master synchronization logic asserts the master TBS signal (548) when an external synchronization signal (550) and the external synchronization enable signal (552) are asserted, or when the output from the period comparator (510) is asserted; a plurality of pulse width modulation (PWM) generators (630) for generating a plurality of phase related PWM signals, each of said plurality of PWM generators (630) may comprise a phase register (662) storing a one of a plurality of phase values; a duty cycle counter (660) coupled to the phase register (662) and the clock generating the plurality of clock pulses, wherein the one of the plurality of phase values is loaded into the duty cycle counter (660) as a duty cycle count value when a soft synchronization load signal (670) is asserted, whereby the duty cycle counter (660) increments the duty cycle count value for each of the plurality of clock pulses received; a duty cycle register (656) storing a duty cycle value; a duty cycle comparator (658) coupled to the duty cycle register (656) and the duty cycle counter (660), wherein the duty cycle comparator (658) compares the duty cycle count value to the duty cycle value and generates a one of the plurality of phase related PWM signals when the duty cycle count value is less than or equal to the duty cycle value; a roll-over comparator (664) coupled to the output of the multiplexer (544) and to the duty cycle counter (660), wherein the roll-over comparator (664) compares the roll-over value (546) and the duty cycle count value, then resets the duty cycle count value to zero each time the duty cycle count value is equal to or greater than the roll-over value (546); and slave synchronization logic having a synchronization overrun detect memory (668), wherein a synchronization overrun detect signal (672) is asserted from the synchronization overrun detect memory (668) when the master TBS signal (548) is asserted and is cleared when the roll-over comparator (664) resets the duty cycle count value to zero each time the duty cycle count value is equal to or greater than the roll-over value (546), wherein the soft synchronization load signal (670) is asserted when the synchronization overrun detect signal (672) and the master TBS signal (548) are asserted, and wherein the soft synchronization load signal (670) is asserted when the synchronization overrun detect signal (672) and a new phase value ready signal are asserted.

According to another specific example embodiment of this disclosure, an apparatus for externally synchronizing multiphase pulse width modulation (PWM) signals may comprise: a master time base generator (500) may comprise a master counter (508) having a master count value and coupled to a clock generating a plurality of clock pulses, wherein the master counter (508) increments the master count value for each of the plurality of clock pulses received; a period register (512) having a period value; a period comparator (510) coupled to the period register (512) and the master counter (508), wherein the period comparator (510) compares the master count value to the period value and generates an asserted output when the master count value is equal to or greater than the period value; a capture register (542) having an input coupled to the master counter (508) and a control input coupled to a master time base synchronization (TBS) signal (548), wherein the capture register (542) stores the master count value when the master TBS signal (548) is asserted; a multiplexer (544) having a first input coupled to the period register (512), a second input coupled to the capture register (542), an output comprising a roll-over value (546), and a control input coupled to an external synchronization enable signal (552), wherein the second input is coupled to the output (546) when the external synchronization enable signal (552) is asserted, otherwise the first input is coupled to the output of the multiplexer (544); master synchronization logic, wherein the master synchronization logic asserts the master TBS signal (548) when an external synchronization signal (550) and the external synchronization enable signal (552) are asserted, or when the output from the period comparator (510) is asserted; a plurality of pulse width modulation (PWM) generators (630) for generating a plurality of phase related PWM signals, each of said plurality of PWM generators (630) may comprise a phase register (662) storing a one of a plurality of phase values; a duty cycle counter (660) coupled to the phase register (662) and the clock generating the plurality of clock pulses, wherein the one of the plurality of phase values is loaded into the duty cycle counter (660) as a duty cycle count value when a synchronization load signal (770) is asserted, whereby the duty cycle counter (660) increments the duty cycle count value for each of the plurality of clock pulses received; a duty cycle register (656) storing a duty cycle value; a duty cycle comparator (658) coupled to the duty cycle register (656) and the duty cycle counter (660), wherein the duty cycle comparator (658) compares the duty cycle count value to the duty cycle value and generates a one of the plurality of phase related PWM signals when the duty cycle count value is less than or equal to the duty cycle value; a roll-over comparator (664) coupled to the output of the multiplexer (544) and to the duty cycle counter (660), wherein the roll-over comparator (664) compares the roll-over value (546) and the duty cycle count value, then resets the duty cycle count value to zero each time the duty cycle count value is equal to or greater than the roll-over value (546); and a soft/hard synchronization multiplexer (774) having a control input coupled to a soft synchronization enable signal (772), a first input coupled to a soft synchronization load signal (670), a second input coupled to the master TBS signal (548) and an output generating the synchronization load signal (770), wherein when the soft synchronization enable signal (772) is asserted the soft synchronization load signal (670) generates the synchronization load signal (770) and when the soft synchronization enable signal (772) is not asserted the master TBS signal (548) generates the synchronization load signal (770); synchronization logic having a synchronization overrun detect memory (668), wherein a synchronization overrun detect signal (672) is asserted from the synchronization overrun detect memory (668) when the master TBS signal (548) is asserted and is cleared when the roll-over comparator (664) resets the duty cycle count value to zero each time the duty cycle count value is equal to or greater than the roll-over value (546), and wherein the soft synchronization load signal (670) is asserted when the synchronization overrun detect signal (672) and the master TBS signal (548) are asserted.

According to still another specific example embodiment of this disclosure, a method for externally synchronizing multiphase pulse width modulation (PWM) signals may comprise the steps of: (a) resetting a count value in a master counter when a time base synchronization (TBS) signal is asserted to a reset input of the master counter and then resetting the TBS signal; (b) incrementing the count value of the master counter with a clock pulse from a clock signal; (c) determining whether a synchronization input is asserted, wherein if the synchronization input is asserted, then going to step (e), otherwise going to step (d); (d) comparing the count value to a period value with a first comparator, wherein if the count value is equal to the period value, then going to step (e), otherwise returning to step (b); (e) capturing the count value in a capture register and asserting the TBS signal, then returning to step (a); (f) loading a phase values into a plurality of slave counters; (g) incrementing the phase values in the plurality of slave counters with the clock pulse from the clock signal; (h) comparing the phase values in the plurality of slave counters to the captured count value in the capture register with respective second comparators, wherein if a one of the phase values is equal to the captured count value, then going to step (i), otherwise going to step (j); (i) resetting the phase value to zero in the slave counter and resetting an associated synchronization overrun memory to a first logic level, then going to step (g); (j) determining if the TBS signal is asserted, wherein if the TBS signal is not asserted then going to step (g), and if the TBS signal is asserted then going to step (k); (k) determining whether the associated synchronization overrun memory is at a first or second logic level, wherein if at the second logic level then going to step (f), and if at the first logic level then going to step (l); (l) setting the associated synchronization overrun memory to the second logic level, then going to step (m); (m) determining whether there is a new phase value, wherein if there is the new phase value the going to step (f), otherwise going to step (g).

BRIEF DESCRIPTION OF THE DRAWINGS

A more complete understanding of the present disclosure thereof may be acquired by referring to the following description taken in conjunction with the accompanying drawings wherein.

Figure 1:
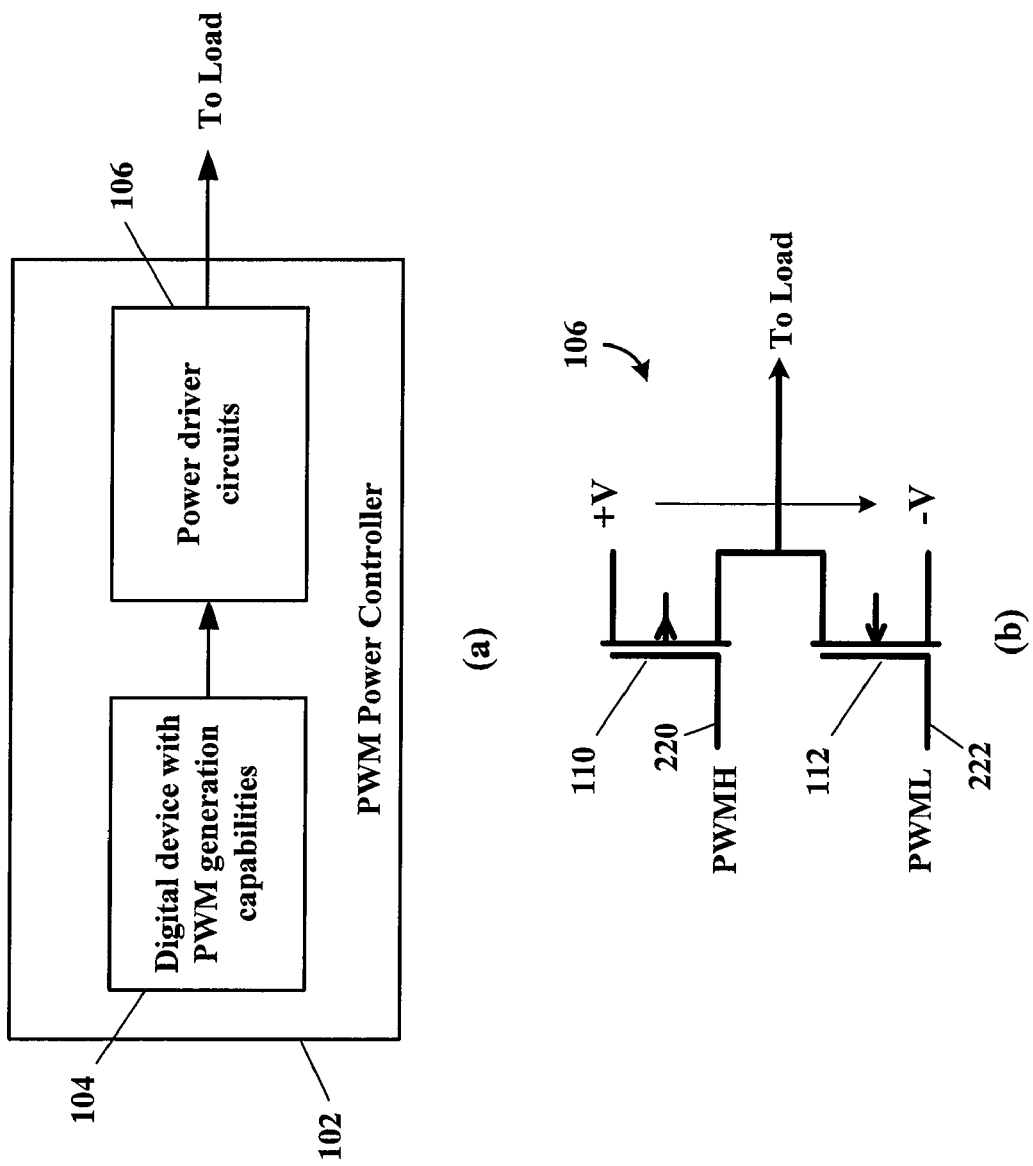
FIG. 1 illustrates a schematic block diagram of a pulse width modulation (PWM) power controller and a schematic connection diagram of a power driver circuit.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawings, the details of example embodiments are schematically illustrated. Like elements in the drawings will be represented by like numbers, and similar elements will be represented by like numbers with a different lower case letter suffix.

Referring to FIG. 1, depicted is a schematic block diagram of a pulse width modulation (PWM) power controller 102 and a schematic connection diagram of a power driver circuit 106. The PWM power controller 102 may comprise a digital device 104 having a plurality of PWM signal generation capabilities, and power driver circuits 106 used to drive a load, e.g., motor, inductive heater, etc. The power driver circuits 106 may comprise power driver transistors 110 and 112 that are used to alternately connect the load (not shown) to either +V (transistor 110 on) or −V (transistor 112 on). Both of the transistors 110 and 112 cannot be on at the same time, otherwise current shoot-through can occur which can be very destructive to the power circuits. Turning the transistors 110 and 112 on and off are controlled by the complementary PWM signals 220 and 222, respectively, from the digital device 104. The transistors 110 and 112 shown represent a driver circuit 106 for a single phase of an inductive load. For a multi-phase inductive load, e.g., a polyphase motor, a pair of the transistors 110 and 112 would be used for each of the phases, e.g., three phases.

Figure 2:
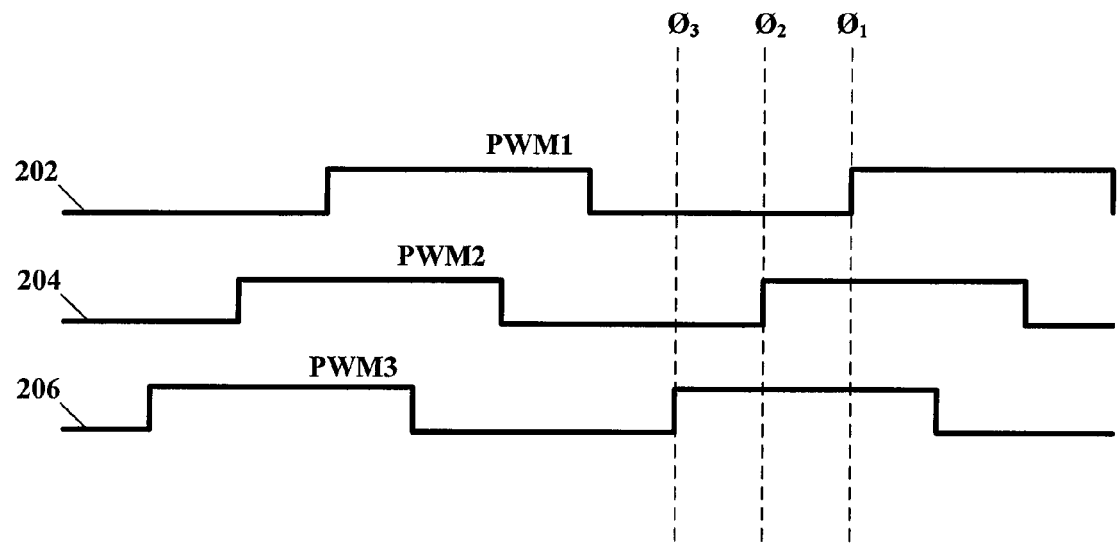
FIG. 2 illustrates a schematic timing diagram of three PWM waveform signals shifted in phase.

Referring to FIG. 2, depicted is a schematic timing diagram of three PWM waveform signals shifted in time. The three phase PWM signals waveforms 202, 204 and 206 are shifted in time, e.g., by 120 degrees, and the three time phase positions of the PWM signals waveforms 202, 204 and 206 are represented by Ø1, Ø2 and Ø3, respectively.

Figure 3:
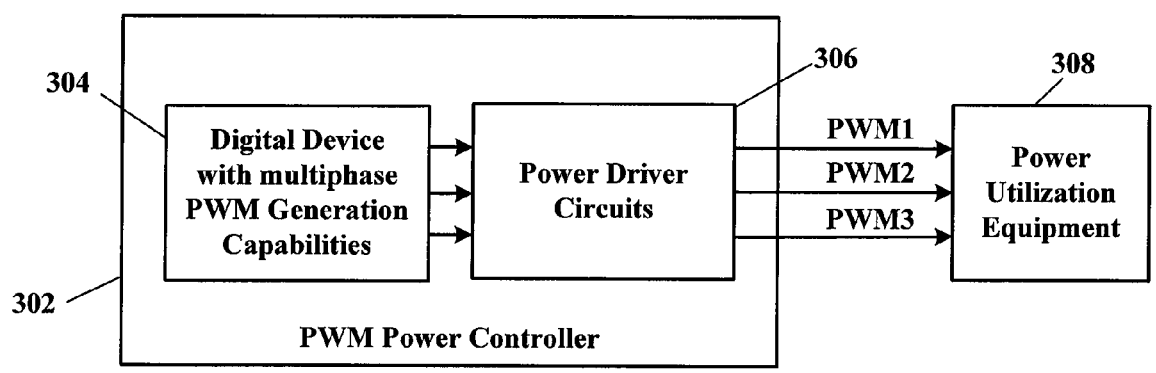
FIG. 3 illustrates a schematic block diagram of a multiphase PWM power controller driving multiphase power utilization equipment.

Referring to FIG. 3, depicted is a schematic block diagram of a multiphase PWM power controller driving multiphase power utilization equipment. The PWM power controller 302 may comprise a digital device 304 having at least three PWM signal generation capabilities, and power driver circuits 306 used to drive multiphase power utilization equipment 308, e.g., motor, resistance heater, induction heater, power conversion equipment, power inverter, variable drive, etc.

Figure 4:
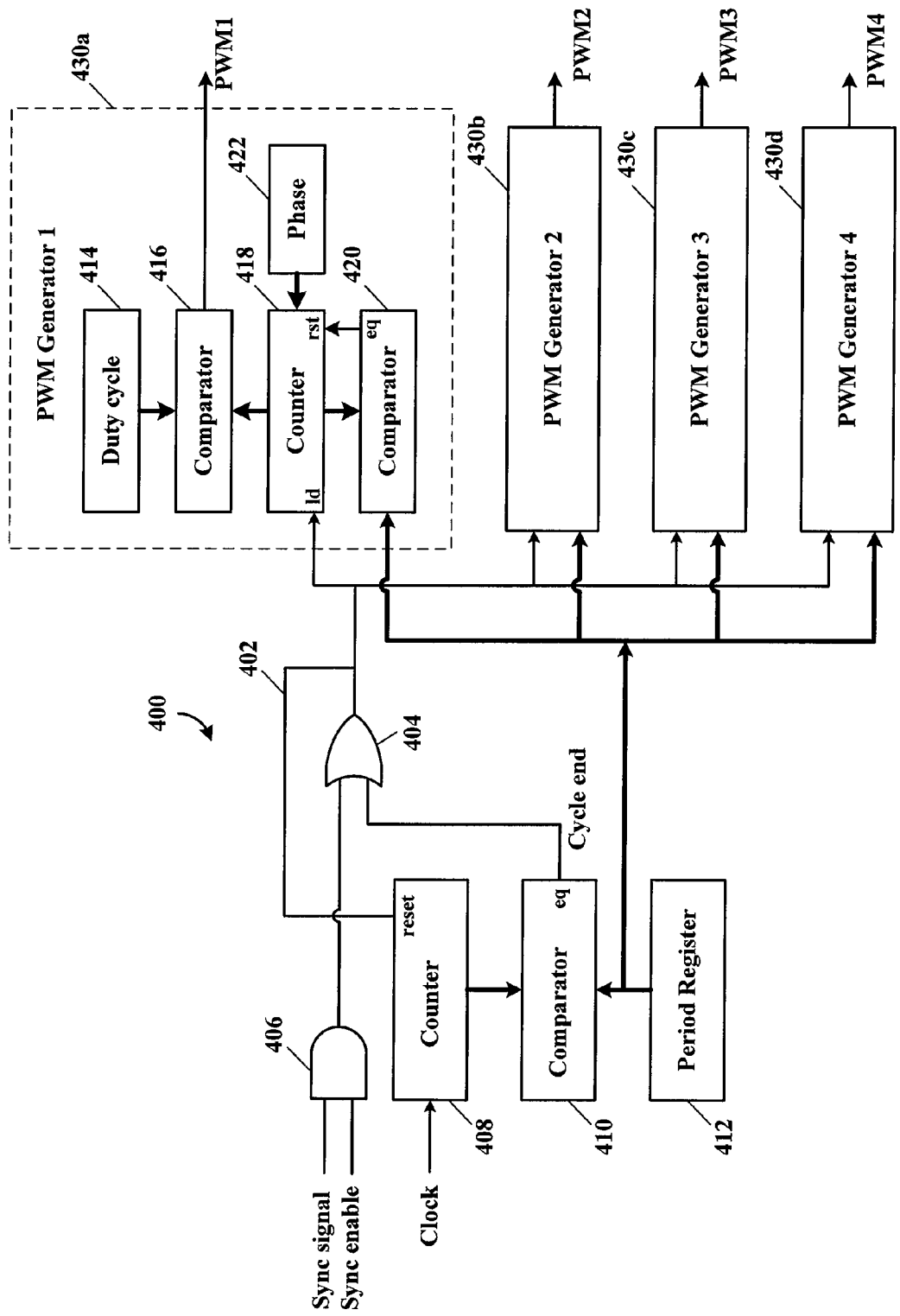
FIG. 4 illustrates a schematic block diagram of a multiphase PWM generation system having a plurality of individual PWM generators coupled to a master time base with external synchronization that loads the master time base period value into the plurality of individual PWM generators upon an external sync signal event.

Referring to FIG. 4, depicted is a schematic block diagram of a multiphase PWM generation system having a plurality of individual PWM generators coupled to a master time base with external synchronization that loads the master time base period value into the plurality of individual PWM generators upon an external sync signal event. A master time base 400 comprises a counter 408, a comparator 410 and a period register 412. Every time the counter counts a value the same as a period value in the period register 412, i.e., the count value is equal to the period value, a load pulse 402 is sent to the PWM generators 430, and, in addition, the value in the counter 408 is reset, e.g., to zero. When an external synchronization is enabled (Sync enable=1) and an external synchronization pulse is received (Sync signal=1), the load pulse 402 is also sent to the PWM generators 430. The circuit represented in FIG. 4 utilizes a "hard synchronization" operation. AND gate 406 performs the logic for the hard synchronization enable and OR gate 404 combines a hard sync pulse with a cycle end pulse from the comparator 410 to produce the load pulse 402.

A PWM generator 430 comprises a duty cycle register 414, a duty cycle comparator 416, a counter 418, a period comparator 420 and a phase register 422. The period comparator 420 compares the period value from the period register 412 to the count value of the counter 418 until both are equal then the comparator 420 resets the count value of the counter 418 to zero. However, whenever there is a load pulse 402 (because the comparator determines a cycle end or an external synchronization is received with the external synchronization enabled), the counter 418 will be loaded with the phase value from the phase register 422. A plurality of PWM generators 430 may be controlled as described hereinabove. However, when performing external synchronization with multiphase PWM, the period of the external sync signal is not known. This may cause waveform errors between the multiphase PWM signals because each one of the respective phase PWM generators 430 uses an internal time base value in the duty cycle register 414 while the master time base 400 is controlled by the external sync signal.

Figure 5:
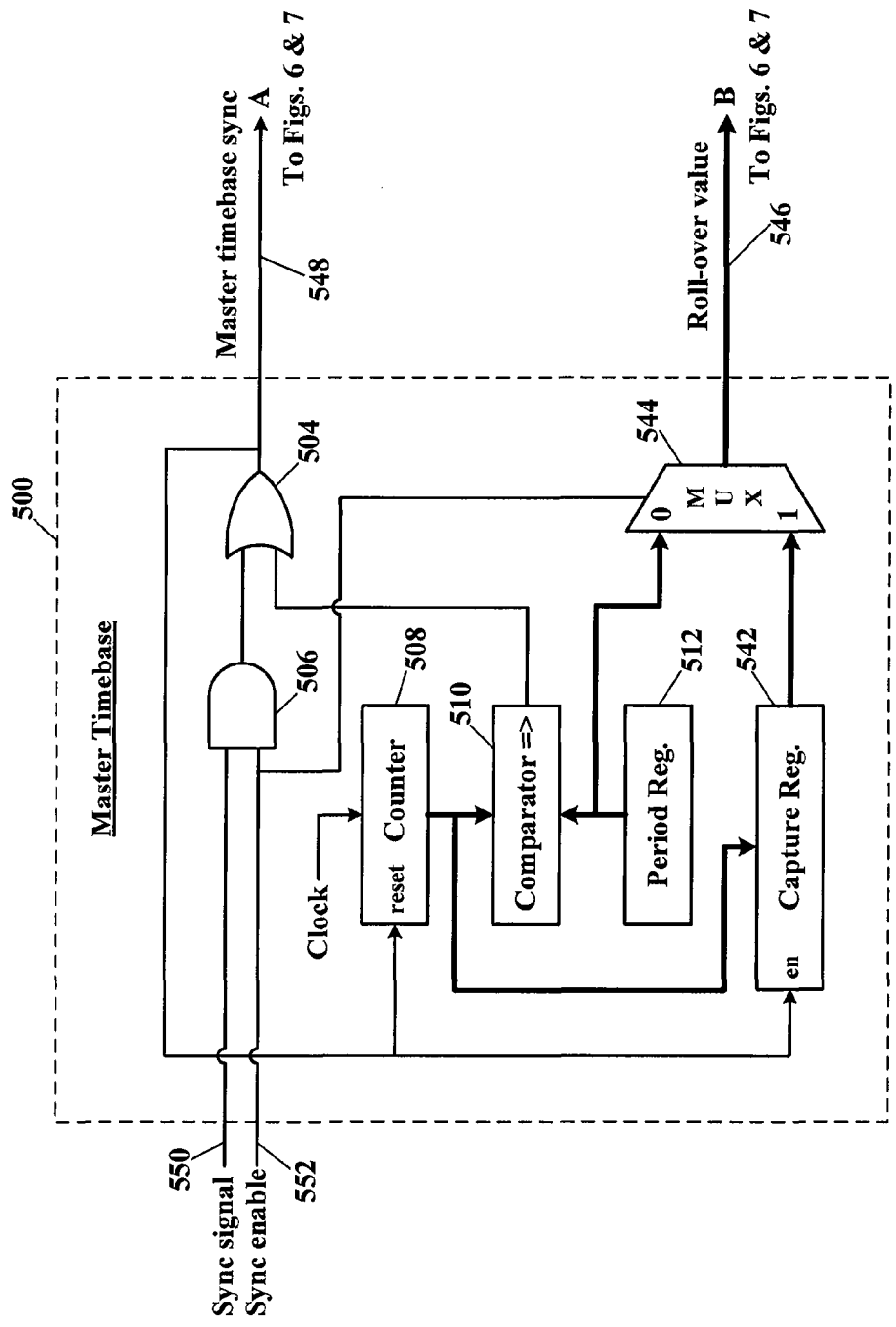
FIG. 5 illustrates a schematic block diagram of a master time base having external synchronization, according to specific example embodiments of this disclosure.

Referring to FIG. 5, depicted is a schematic block diagram of a master time base having external synchronization, according to specific example embodiments of this disclosure. The master time base 500 comprises a counter 508, a comparator 510, a period register 512, a capture register 542, a multiplexer 544, an AND gate 506, and an OR gate 504. The counter 510 increments a count value therein at each clock until this count value is equal to a period value stored in the period register 512. Then the comparator 510, through the OR gate 504, causes the capture register 542 to store ("capture") the count value just before it is reset to zero and the counter 508 to reset the count value to zero. During a normal count operation without an external synchronization enabled (external synchronization enable 552 at a logic low), the value captured in the capture register 542 will be the same as the period value stored in the period register 512. The multiplexer 544 will couple the period value in the period register 512 to become the roll over value on output 546 of the multiplexer 542.

However, if the external synchronization enable 552 is at a logic high (enabled) and an external synchronization signal 552 is asserted, then through the AND gate 506 and the OR gate 504, the capture register 542 will store ("capture") the count value at the time of the assertion of the external synchronization signal 550 and then the count value will be reset to zero. This can occur at any count value. The multiplexer 544 will couple the count value in the capture register 542 to become the roll over value on output 546 of the multiplexer 542. A master time base synchronization (TBS) signal 548 on the output of the OR gate 504 is generated when the count value of the counter 508 and the period value stored in the period register 512 are equal, or when the external synchronization enable 552 is enabled and the external synchronization signal 552 is asserted.

Figure 6:
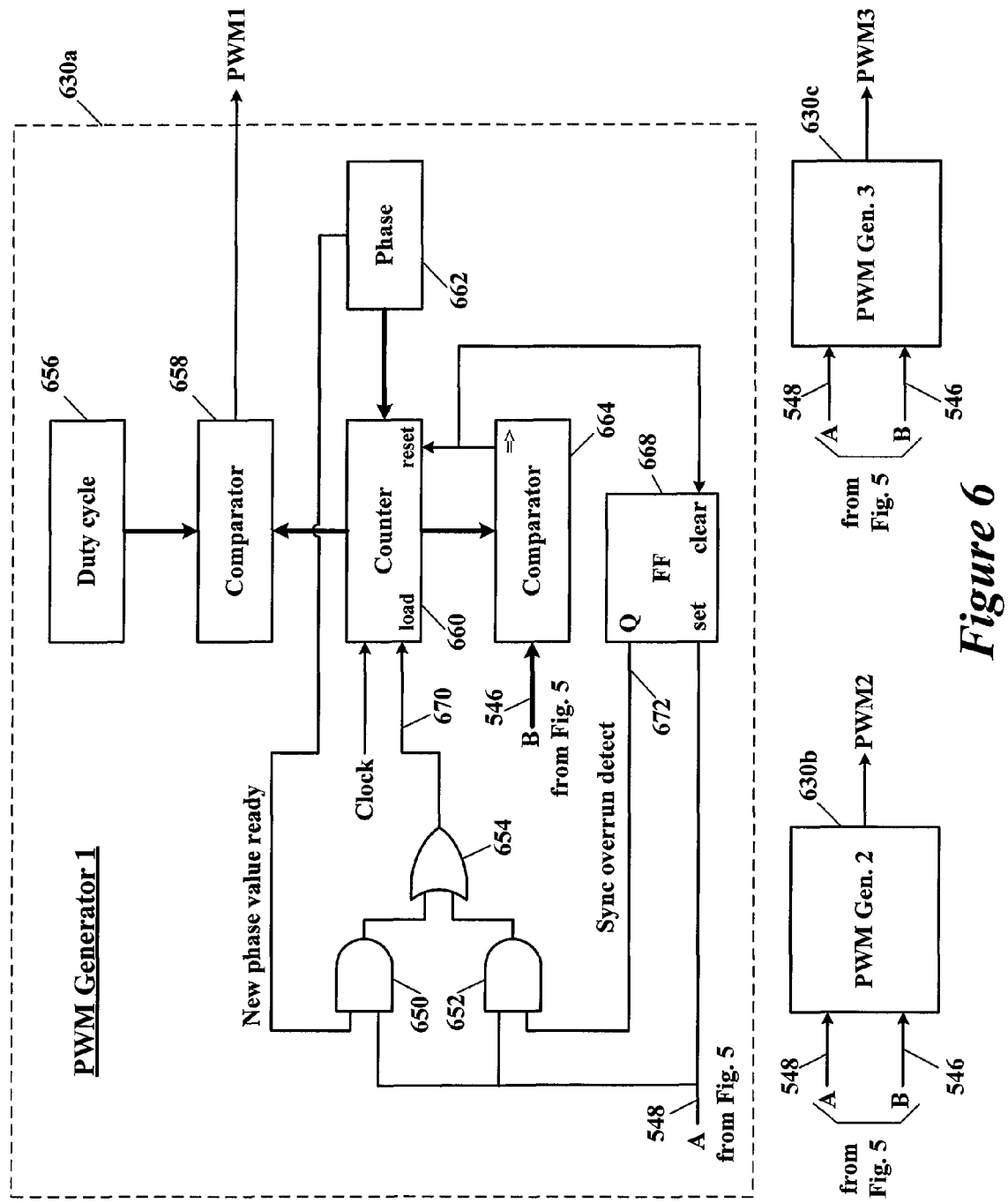
FIG. 6 illustrates a schematic block diagram of a plurality of PWM generators coupled to the master time base shown in FIG. 5 and having soft synchronization therewith, according to a specific example embodiment of this disclosure.

Referring to FIG. 6, depicted is a schematic block diagram of a plurality of PWM generators coupled to the master time base shown in FIG. 5 and having soft synchronization therewith, according to a specific example embodiment of this disclosure. Each of the plurality of PWM generators 630 comprise a duty cycle register 656, a duty cycle comparator 658, a counter 660, a phase register 662, a period comparator 664, a flip-flop 668, an OR gate 654, and AND gates 650 and 652.

Figure 7:
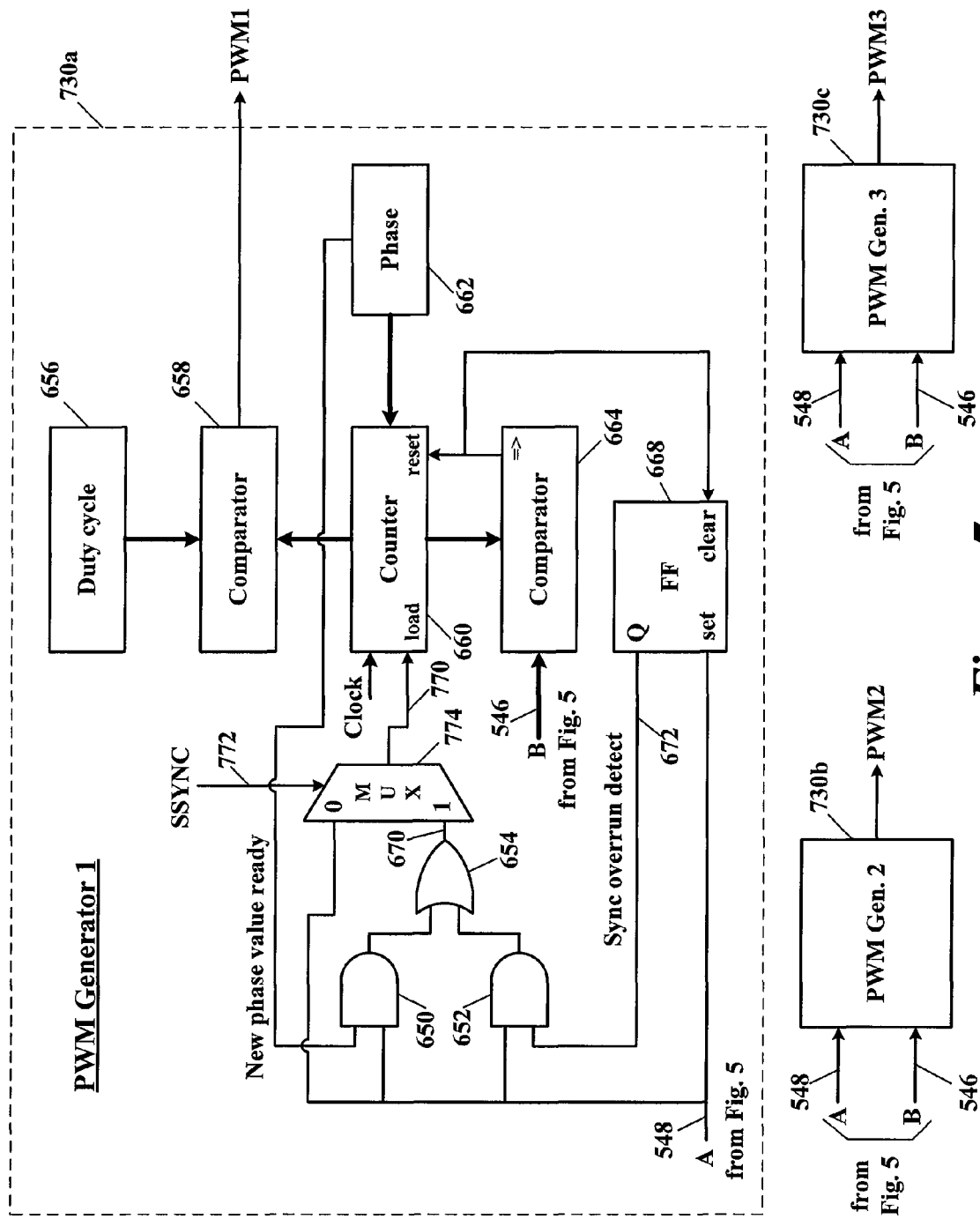
FIG. 7 illustrates a schematic block diagram of a plurality of PWM generators coupled to the master time base shown in FIG. 5 and having selectable hard or soft synchronization therewith, according to another specific example embodiment of this disclosure.

The multiplexer 544 selects either the period value in the period register 512 or the captured count value in the capture register 542 as the source of the roll-over value for the individual PWM generator time base counters (FIGS. 6 and 7). This selection is controlled by the external synchronization enable 552 (FIG. 5). The selected roll-over value (period value or captured count value) from the multiplexer 544 is broadcast to the plurality of PWM generators 630. The comparators 664 in each of the plurality of PWM generators 630 constantly compare the broadcast roll-over value from the output 546 of the multiplexer 544 (roll over value shown in FIG. 5) with the count values in each of the time base counters 660 to determine when the respective counters 660 should be reset to zero (rolled over) when both values are equal or the count value of the counter 660 is greater than the roll-over value from the output 546.

The phase value stored in the phase register 662 is loaded into the counter 660 when a synchronization load signal 670 from the output of the OR gate 654 is asserted. The synchronization load signal 670 is asserted when a new phase value is ready in the phase register 662 and the master time base synchronization signal 548 is asserted from the output of the OR gate 504. The synchronization load signal 670 is also asserted when a synchronization overrun detect signal 672 from the Q output of the flip-flop 668 is asserted and the master time base synchronization signal 548 is asserted from the output of the OR gate 504. The Q output of the flip-flop is set to a logic high when the master time base synchronization signal 548 is asserted from the output of the OR gate 504, and stays at the logic high unless reset by the output of the comparator 664 during roll over to zero of the count value in the counter 660.

Each external synchronization pulse 550 captures the existing count value of the master time base counter 508, then resets the master time base counter 508 and generates a time base synchronization (TBS) signal 548 for broadcast to each of the PWM generators 630. The captured master counter value (CMCV) stored in the capture register 542 represents the time period since the previous synchronization pulse 550 was received. The CMCV becomes the time period for the output signals of each PWM generator 630. If an external synchronization pulse 550 is not received, the master counter 508 continues to count until it reaches the terminal count value specified by the user in the period register 512. At that time, a master TBS signal 548 is generated and the master counter 508 is reset. In both cases, the counting cycle master counter 508 repeats continuously.

Under most conditions, the counter 660 of each PWM generator 630 will count until its value matches the CMCV, then reset and start the count cycle over. In these cases, the CMCV, which is the period of the TBS signal 548, insures that the output PWM signals have the same period as the TBS signal 548. The PWM outputs from the PWM generator 630 will track the synchronization signal. This process is called soft synchronization.

If the period of the master TBS signal 548 varies widely from cycle to cycle (from a long to a short period), it is possible for the individual PWM generators 630 to become unsynchronized because those of its individual PWM counters 660 with large phase offsets (delay) are still processing the previous synchronization phase adjustment process when the next synchronization phase adjustment is requested. Such situations are called "Sync Overrun." By definition, if a previous soft synchronize process has not completed before the next master TBS signal 548 is received, the Sync Overrun condition is detected.

If Sync-Overrun occurs (detected on a per generator basis), the PWM generator 630 performs a "Hard Synchronization" to restore order. In these cases, the individual PWM counter 660 is immediately loaded with the contents of its associated phase register 662. Similarly, if the user revises the contents of the phase registers 662, the PWM generators 630 force a hard synchronization event upon the occurrence of the next master TBS signal 548.

Referring to FIG. 7, depicted is a schematic block diagram of a plurality of PWM generators coupled to the master time base shown in FIG. 5 and having selectable hard or soft synchronization therewith, according to another specific example embodiment of this disclosure. The PWM generator circuit shown in FIG. 7 is similar to the circuit shown in FIG. 6 and describe hereinabove, except that the addition of a multiplexer 774 allows user selection of either hard synchronization or soft synchronization. When the SSYNC signal on the control input 772 of the multiplexer 774 is at a logic low ("0"), the PWM generator 730a operates in the hard synchronization mode similar to the circuit shown in FIG. 4, and when the SSYNC signal on the control input 772 of the multiplexer 770 is at a logic high ("1"), the PWM generator 730a operates in the soft synchronization mode as more fully described for the circuit shown in FIG. 6. Thus using either hard synchronization or soft synchronization is user selectable through the SSYNC input 772.

Figure 8:
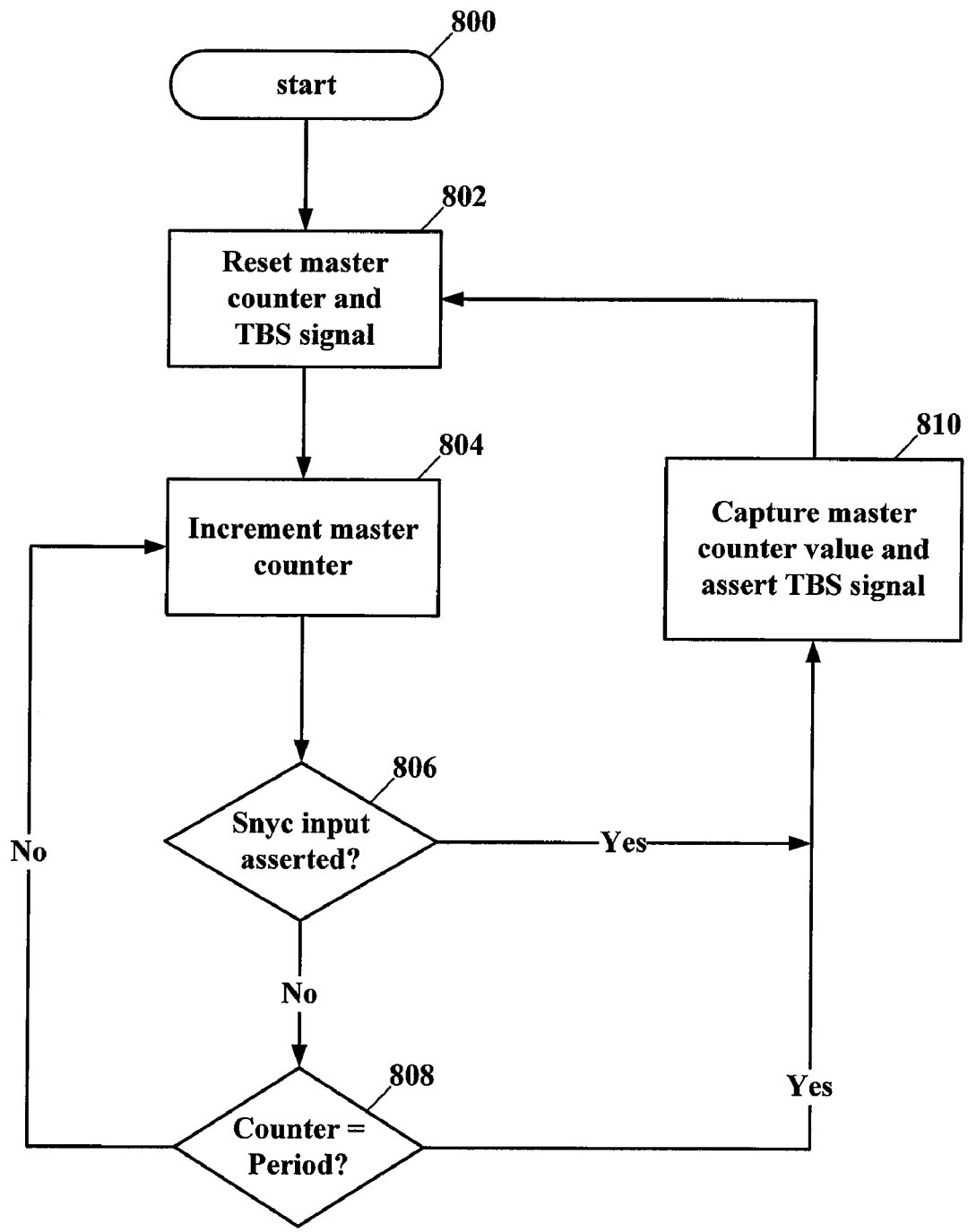
FIG. 8 illustrates a schematic flow diagram of a representative operation of a master time base, according to a specific example embodiment of this disclosure.

Referring to FIG. 8, depicted is a schematic flow diagram of a representative operation of a master time base, according to a specific example embodiment of this disclosure. The master time base 500 starts in step 800. In step 802, the master counter 508 is reset when the master TBS signal 548 is asserted. In step 804, the master counter 508 increments on each clock until reset again by the master TBS signal 548 from step 810. The master counter 508 continues to increment until the assertion of a sync signal 550 is detected in step 806. When the sync signal 550 is detected in step 806, step 810 captures in the capture register 542 the present count value in the master counter 508. Step 808 detects when the count value in the master counter 508 is equal to a period value stored in the period register 512, and causes step 810 to reset the master counter 508 with the assertion of the master TBS signal 548.

Also the assertion of the master TBS signal 548 of Step 810 captures in the capture register 542 the present count value in the master counter 508 before the master counter 508 count resets back to zero.

Figure 9:
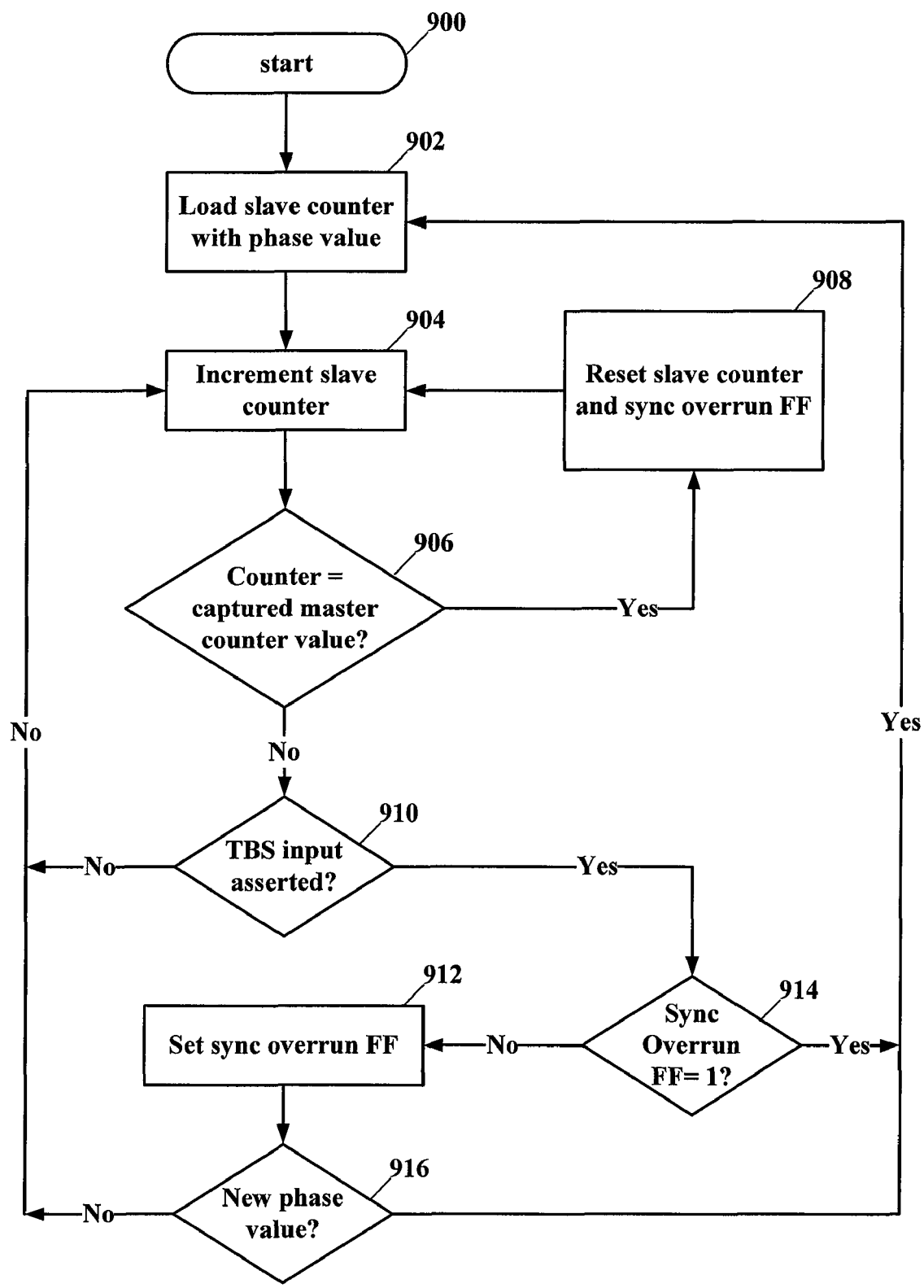
FIG. 9 illustrates a schematic flow diagram of a representative operation of a one of the PWM generator time bases, according to a specific example embodiment of this disclosure.

Referring to FIG. 9, depicted is a schematic flow diagram of a representative operation of a one of the PWM generator time bases, according to a specific example embodiment of this disclosure. Each of the PWM generators 630 or 730 will start in step 900 which, in step 902, causes appropriate phase values to be loaded into the respective slave counters 660. Then in step 904, the contents of the slave counters 660 will increment on each clock until step 906 determines that the count value of the slave counters 660 is equal to the rollover value 546 (either the value of the master period register 512 or the value of the capture register 542). Then step 908 will reset the slave counter 660 and the sync overrun flip-flop 668.

In step 910, if the master TBS signal 548 is not asserted, then the count value of the slave counter 660 will continue to increment on each clock. When step 810 asserts the master TBS signal 548, step 910 detects the assertion of the master TBS signal 548, and then step 914 determines whether the output of the sync overrun flip-flop 668 is asserted (e.g., at a logic 1). If the output of the sync overrun flip-flop 668 is not asserted, then step 912 sets the sync overrun flip-flop 668 so that its output is now asserted. However, if the output of the sync overrun flip-flop 668 is asserted then step 914 causes step 902 to load the appropriate phase values into the respective slave counters 660. If no new phase is determined in step 916, then the contents of the slave counters 660 will increment on each clock. If a new phase value is determined in step 916, then step 902 will cause the new phase values to be loaded into the respective slave counters 660.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. An apparatus for externally synchronizing multiphase pulse width modulation (PWM) signals, said apparatus comprising:
   a master time base generator (500) comprising:
      a master counter (508) having a master count value and coupled to a clock generating a plurality of clock pulses, wherein the master counter (508) increments the master count value for each of the plurality of clock pulses received;
      a period register (512) having a period value;
      a period comparator (510) coupled to the period register (512) and the master counter (508), wherein the period comparator (510) compares the master count value to the period value and generates an asserted output when the master count value is equal to or greater than the period value;
      a capture register (542) having an input coupled to the master counter (508) and a control input coupled to a master time base synchronization (TBS) signal (548), wherein the capture register (542) stores the master count value when the master TBS signal (548) is asserted;

a multiplexer (544) having a first input coupled to the period register (512), a second input coupled to the capture register (542), an output comprising a roll-over value (546), and a control input coupled to an external synchronization enable signal (552), wherein the second input is coupled to the output (546) when the external synchronization enable signal (552) is asserted, otherwise the first input is coupled to the output of the multiplexer (544);

master synchronization logic, wherein the master synchronization logic asserts the master TBS signal (548) when an external synchronization signal (550) and the external synchronization enable signal (552) are asserted, or when the output from the period comparator (510) is asserted;

a plurality of pulse width modulation (PWM) generators (630) for generating a plurality of phase related PWM signals, each of said plurality of PWM generators (630) comprising:

a phase register (662) storing a one of a plurality of phase values;

a duty cycle counter (660) coupled to the phase register (662) and the clock generating the plurality of clock pulses, wherein the one of the plurality of phase values is loaded into the duty cycle counter (660) as a duty cycle count value when a soft synchronization load signal (670) is asserted, whereby the duty cycle counter (660) increments the duty cycle count value for each of the plurality of clock pulses received;

a duty cycle register (656) storing a duty cycle value;

a duty cycle comparator (658) coupled to the duty cycle register (656) and the duty cycle counter (660), wherein the duty cycle comparator (658) compares the duty cycle count value to the duty cycle value and generates a one of the plurality of phase related PWM signals when the duty cycle count value is less than or equal to the duty cycle value;

a roll-over comparator (664) coupled to the output of the multiplexer (544) and to the duty cycle counter (660), wherein the roll-over comparator (664) compares the roll-over value (546) and the duty cycle count value, then resets the duty cycle count value to zero each time the duty cycle count value is equal to or greater than the roll-over value (546); and soft synchronization logic having a synchronization overrun detect memory (668),
wherein a synchronization overrun detect signal (672) is asserted from the synchronization overrun detect memory (668) when the master TBS signal (548) is asserted and is cleared when the roll-over comparator (664) resets the duty cycle count value to zero each time the duty cycle count value is equal to or greater than the roll-over value (546),
wherein the soft synchronization load signal (670) is asserted when the synchronization overrun detect signal (672) and the master TBS signal (548) are asserted, and
wherein the soft synchronization load signal (670) is asserted when the synchronization overrun detect signal (672) and a new phase value ready signal are asserted.

2. An apparatus for externally synchronizing multiphase pulse width modulation (PWM) signals, said apparatus comprising:

a master time base generator (500) comprising:
a master counter (508) having a master count value and coupled to a clock generating a plurality of clock pulses, wherein the master counter (508) increments the master count value for each of the plurality of clock pulses received;

a period register (512) having a period value;

a period comparator (510) coupled to the period register (512) and the master counter (508), wherein the period comparator (510) compares the master count value to the period value and generates an asserted output when the master count value is equal to or greater than the period value;

a capture register (542) having an input coupled to the master counter (508) and a control input coupled to a master time base synchronization (TBS) signal (548), wherein the capture register (542) stores the master count value when the master TBS signal (548) is asserted;

a multiplexer (544) having a first input coupled to the period register (512), a second input coupled to the capture register (542), an output comprising a roll-over value (546), and a control input coupled to an external synchronization enable signal (552), wherein the second input is coupled to the output (546) when the external synchronization enable signal (552) is asserted, otherwise the first input is coupled to the output of the multiplexer (544);

master synchronization logic, wherein the master synchronization logic asserts the master TBS signal (548) when an external synchronization signal (550) and the external synchronization enable signal (552) are asserted, or when the output from the period comparator (510) is asserted;

a plurality of pulse width modulation (PWM) generators (630) for generating a plurality of phase related PWM signals, each of said plurality of PWM generators (630) comprising:

a phase register (662) storing a one of a plurality of phase values;

a duty cycle counter (660) coupled to the phase register (662) and the clock generating the plurality of clock pulses, wherein the one of the plurality of phase values is loaded into the duty cycle counter (660) as a duty cycle count value when a synchronization load signal (770) is asserted, whereby the duty cycle counter (660) increments the duty cycle count value for each of the plurality of clock pulses received;

a duty cycle register (656) storing a duty cycle value;

a duty cycle comparator (658) coupled to the duty cycle register (656) and the duty cycle counter (660), wherein the duty cycle comparator (658) compares the duty cycle count value to the duty cycle value and generates a one of the plurality of phase related PWM signals when the duty cycle count value is less than or equal to the duty cycle value;

a roll-over comparator (664) coupled to the output of the multiplexer (544) and to the duty cycle counter (660), wherein the roll-over comparator (664) compares the roll-over value (546) and the duty cycle count value, then resets the duty cycle count value to zero each time the duty cycle count value is equal to or greater than the roll-over value (546); and a soft/hard synchronization multiplexer (774) having a control input coupled to a soft synchronization enable signal (772), a first input coupled to a soft synchronization load signal (670), a second input coupled to the master TBS signal (548) and an output generating the synchronization load signal (770), wherein when the soft synchronization enable signal (772) is asserted the soft synchronization load signal (670) generates the synchronization load signal (770) and when the soft synchronization enable signal (772) is not asserted the master TBS signal (548) generates the synchronization load signal (770);

synchronization logic having a synchronization overrun detect memory (668), wherein a synchronization overrun detect signal (672) is asserted from the synchronization overrun detect memory (668) when the master TBS signal (548) is asserted and is cleared when the roll-over comparator (664) resets the duty cycle count value to zero each time the duty cycle count value is equal to or greater than the roll-over value (546), and wherein the soft synchronization load signal (670) is asserted when the synchronization overrun detect signal (672) and the master TBS signal (548) are asserted.

3. A method for externally synchronizing multiphase pulse width modulation (PWM) signals, said method comprising the steps of:

(a) resetting a count value in a master counter when a time base synchronization (TBS) signal is asserted to a reset input of the master counter and then resetting the TBS signal;

(b) incrementing the count value of the master counter with a clock pulse from a clock signal;

(c) determining whether a synchronization input is asserted, wherein if the synchronization input is asserted, then going to step (e), otherwise going to step (d);

(d) comparing the count value to a period value with a first comparator, wherein if the count value is equal to the period value, then going to step (e), otherwise returning to step (b);

(e) capturing the count value in a capture register and asserting the TBS signal, then returning to step (a);

(f) loading a phase values into a plurality of slave counters;

(g) incrementing the phase values in the plurality of slave counters with the clock pulse from the clock signal;

(h) comparing the phase values in the plurality of slave counters to the captured count value in the capture register with respective second comparators, wherein if a one of the phase values is equal to the captured count value, then going to step (i), otherwise going to step (j);

(i) resetting the phase value to zero in the slave counter and resetting an associated synchronization overrun memory to a first logic level, then going to step (g);

(j) determining if the TBS signal is asserted, wherein if the TBS signal is not asserted then going to step (g), and if the TBS signal is asserted then going to step (k);

(k) determining whether the associated synchronization overrun memory is at a first or second logic level, wherein if at the second logic level then going to step (f), and if at the first logic level then going to step (l);

(l) setting the associated synchronization overrun memory to the second logic level, then going to step (m);

(m) determining whether there is a new phase value, wherein if there is the new phase value the going to step (f), otherwise going to step (g).

* * * * *